United States Patent [19]
Koide

[11] Patent Number: 5,006,816
[45] Date of Patent: Apr. 9, 1991

[54] SEMICONDUCTOR INTEGRATED CIRCUIT INCLUDING DIFFERENTIAL TRANSISTOR CIRCUIT HAVING A PAIR OF FETS

[75] Inventor: Nobuo Koide, Tokyo, Japan

[73] Assignee: Kabushiki Kaisha Toshiba, Kawasaki, Japan

[21] Appl. No.: 530,455

[22] Filed: Jun. 1, 1990

Related U.S. Application Data

[63] Continuation of Ser. No. 373,829, Jun. 29, 1989, abandoned.

[30] Foreign Application Priority Data

Jun. 30, 1988 [JP] Japan .................. 63-163286

[51] Int. Cl.$^5$ .............................. H03F 3/45
[52] U.S. Cl. ...................... 330/253; 330/307; 357/23.14
[58] Field of Search ............... 330/253, 307; 357/23.14, 46

[56] References Cited

U.S. PATENT DOCUMENTS 4,084,173  4/1978  Fantechi .................. 357/23.14 X

FOREIGN PATENT DOCUMENTS

WO85/02061  5/1985  PCT Int'l Appl. .

Primary Examiner—James B. Mullins
Attorney, Agent, or Firm—Finnegan, Henderson, Farabow, Garrett, and Dunner

[57] ABSTRACT

A semiconductor integrated circuit includes a differential transistor circuit having first and second FETs which each include a drain, a source and a gate and whose sources are connected to each other. The differential transistor circuit of the semiconductor integrated circuit includes a plurality of first divided drain regions and second divided drain regions of the same number as that of the first divided drain regions, the first and second divided drain regions being alternately arranged at a regular interval and respectively serving as the drains of the first and second FETs, a plurality of divided source regions each arranged between an adjacent two of the first and second divided drain regions and serving as the sources of the first and second FETs, a plurality of first divided gate electrodes arranged between the first divided drain regions and the divided source regions and serving as the gate of the first FET, and a plurality of second divided gate electrodes arranged between the second divided drain regions and the divided source regions and serving as the gate of the second FET.

10 Claims, 4 Drawing Sheets

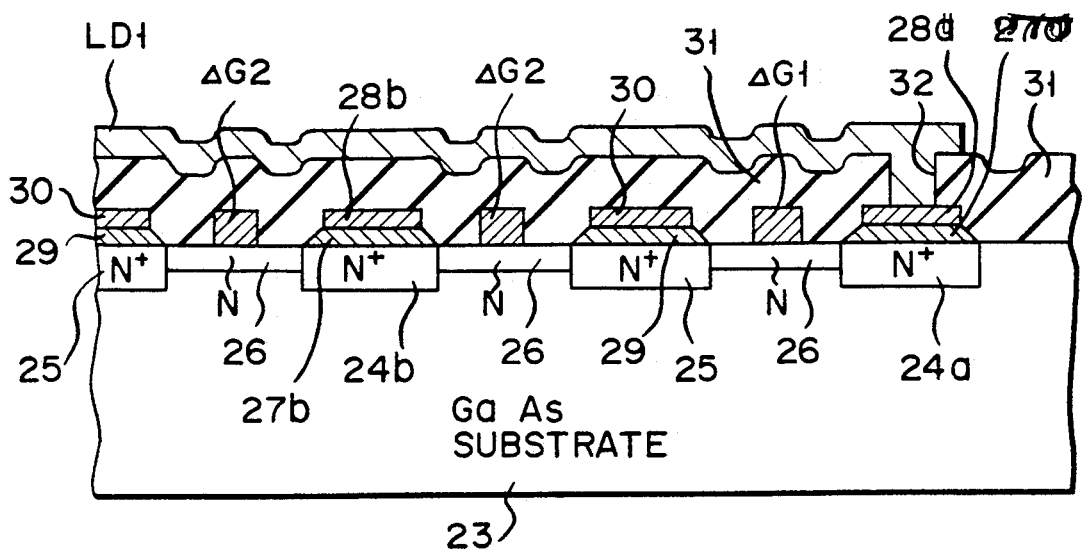
F I G. 6
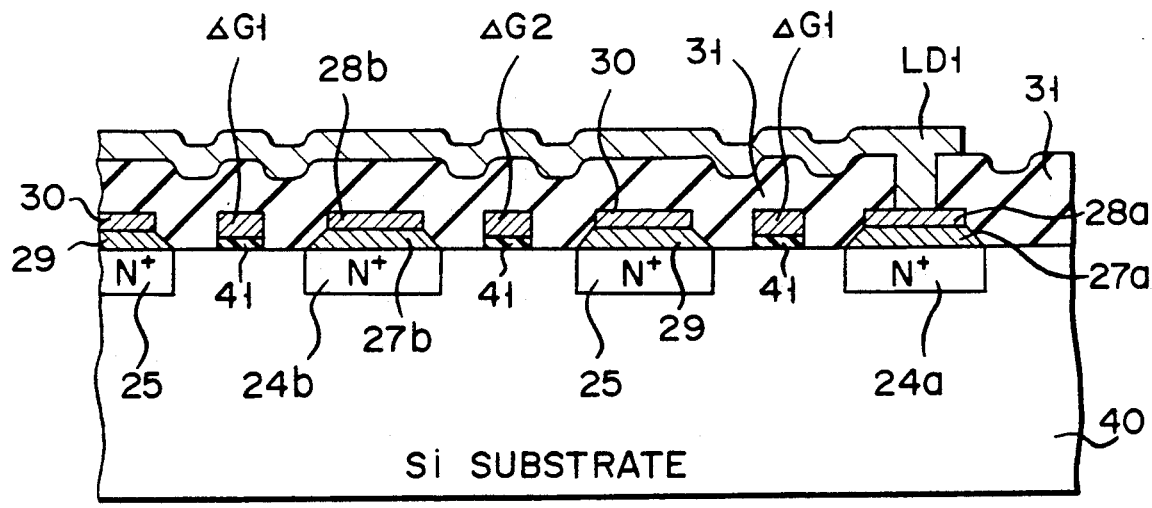
F I G. 7

SEMICONDUCTOR INTEGRATED CIRCUIT INCLUDING DIFFERENTIAL TRANSISTOR CIRCUIT HAVING A PAIR OF FETS

This application is a continuation of application Ser. No. 07/373,829, filed June 29, 1989, now abandoned.

BACKGROUND OF THE INVENTION

1. Field of the Invention

This invention relates to a semiconductor integrated circuit such as a differential amplifier or operation amplifier including a differential source-coupled field effect transistor circuit having a pair of MESFETs (Schottky barrier gate type field effect transistors) or a pair of MOSFETs (insulated gate type field effect transistors).

2. Description of the Related Art

FIG. 1 shows an ordinary differential transistor circuit using a pair of MESFETs and FIG. 2 shows a plane pattern of the circuit. In FIGS. 1 and 2, source electrode S is used commonly for two MESFETs Q1 and Q2. Source electrode S is connected to source electrode wiring LS including source terminal TS. Drain electrodes D1 and D2 are respectively connected to drain electrode wiring LD1 including drain terminal TD1 and drain electrode wiring LD2 including drain terminal TD2. Gate electrodes G1 and G2 are respectively connected to gate electrode wiring LG1 including gate terminal TG1 and gate electrode wiring LG2 including gate terminal TG2. In FIG. 2, reference numerals 11 and 12 respectively denote connecting portions between gate electrodes G1 and G2 of FETs Q1 and Q2 and metal wirings LG1 and LG2. Further, region 10 surrounded by broken lines indicates the position of an active region including L+-type source and drain regions of high impurity concentration formed in a semi-insulative GaAs substrate.

In a case where the offset voltage of the differential transistor circuit is reduced, it is important to match the electric characteristics such as transmission admittances or drain voltage-current characteristics of two FETs to each other (hereinafter, matched electric characteristics are referred to as a pair property). For this reason, the shapes and materials of corresponding portions of a pair of MESFETs Q1 and Q2, for example the impurity concentration distributions of the channel active layer and the sizes thereof, are set equal to each other. If the pair property of paired FETs Q1 and Q2 is satisfactory, the same variations will occur in the electrical characteristics of the FETs even when the power source voltage or temperature has changed. As a result, occurrence of the offset voltage can be prevented and stable operation can be attained.

In a circuit having a pattern designed as shown in FIG. 2, since drain electrodes D1 and D2 are disposed extremely close to each other, the pair property of FETs Q1 and Q2 can be set relatively satisfactorily. However, the circuit has a drawback in that the operation speed is low. The drawback is explained below with reference to FIG. 3.

In FIG. 3, the abscissa indicates width WG of each of electrodes G1 and G2 and the ordinate indicates propagation delay time Tpd of a differential transistor circuit including FETs having gate electrode width WG. Propagation delay time Tpd represents time required for an output signal appearing between output terminals TD1 and TD2 to reach a predetermined measured potential (for example, a potential which is 50 % of the amplitude of the signal) after a differential input signal of rectangular pulse wave is applied between input terminals TG1 and TG2. In general, as gate electrode width WG increases, the gate current increases and propagation delay time Tpd tends to decrease as shown by curve A in FIG. 3. Actually, however, as shown by curve B of FIG. 3, propagation delay time Tpd increases when gate electrode width WG becomes larger than a preset value. As a result, the operation speed of the differential transistor circuit having the pattern shown in FIG. 2 cannot be sufficiently enhanced even if gate electrode width WG is increased. The reason why a lower limitation is put on the propagation delay time Tpd is that the input parasitic capacitance of the FET and the voltage drop in distributed equivalent resistor R of the gate electrode increase with an increase in gate electrode width WG.

As described above, with the ordinary differential transistor circuit having the pattern shown in FIG. 2, the relatively satisfactory pair property of the paired FETs can be attained, but the operation speed thereof cannot be sufficiently enhanced.

SUMMARY OF THE INVENTION

An object of this invention is to provide a semiconductor integrated circuit in which the pair property of two FETs constituting a differential transistor circuit can be satisfactorily set and the operation speed of the differential transistor circuit can be sufficiently enhanced.

According to this invention, there is provided a semiconductor integrated circuit which includes a differential transistor circuit having first and second FETs which each include a drain, a source and a gate, and whose sources are connected to each other, comprising a plurality of first divided drain regions and second divided drain regions, of the same number as that of the first divided drain regions, the first and second divided drain regions being alternately arranged at a regular interval and respectively acting as the drains of the first and second FETs; a plurality of divided source regions each arranged between each adjacent pair of first and second divided drain regions and acting as the sources of the first and second FETs; a plurality of first divided gate electrodes arranged between the first divided drain regions and the divided source regions and acting as the gate of the first FET; and a plurality of second divided gate electrodes arranged between the second divided drain regions and the divided source regions and acting as the gate of the second FET.

In the above semiconductor integrated circuit, the first FET is constituted by the first divided drain regions, first divided gate electrodes and divided source regions, and the second FET is constituted by the second divided drain regions, second divided gate electrodes and divided source regions. Since the first and second divided drain regions are alternately arranged, the first and second FETs are not separated from each other and can be mixedly disposed in a preset area of the integrated circuit.

In general, the characteristic of the substrate of the semiconductor integrated circuit, for example, the crystal property of the substrate, the temperature distribution in the substrate or the impurity concentration distribution of the substrate may vary in different portions of the substrate. Variation in the characteristic in different portions of the substrate becomes larger as the distance between the different portions becomes larger.

However, in the semiconductor integrated circuit of this invention, the first and second FETs are mixedly disposed in a preset area of the integrated circuit as described before, and therefore the first and second FETs can be formed under substantially the same condition. Thus, a satisfactory pair property of the first and second FETs can be attained.

Further, each gate of the first and second FETs is divided into a plurality of divided gate electrodes. Therefore, the distribution resistance of the gate electrode of each FET can be reduced. As a result, a voltage drop in each gate electrode can be suppressed to a minimum, causing the operation speed of the differential transistor circuit to be enhanced.

BRIEF DESCRIPTION OF THE DRAWINGS

FIG. 6 is a cross sectional view showing the cross section of the arrangement pattern shown in FIG. 5;

FIG. 7 is a cross sectional view showing the cross section of the arrangement pattern shown in FIG. 5 in a case where MOSFETs are arranged in the pattern;

DETAILED DESCRIPTION OF THE PREFERRED EMBODIMENTS

Figure 1:
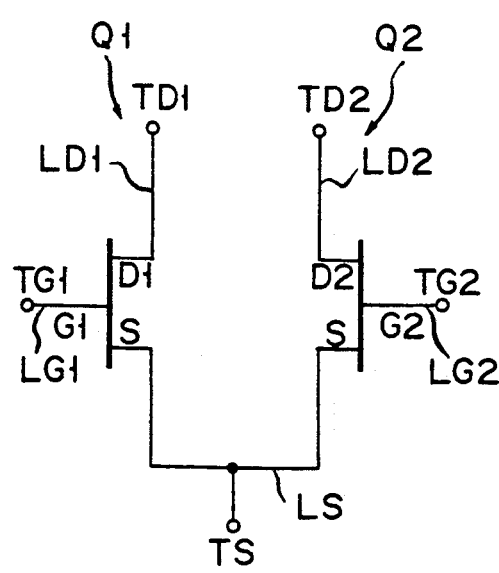
FIG. 1 is a circuit diagram showing an ordinary differential transistor circuit.
Figure 2:
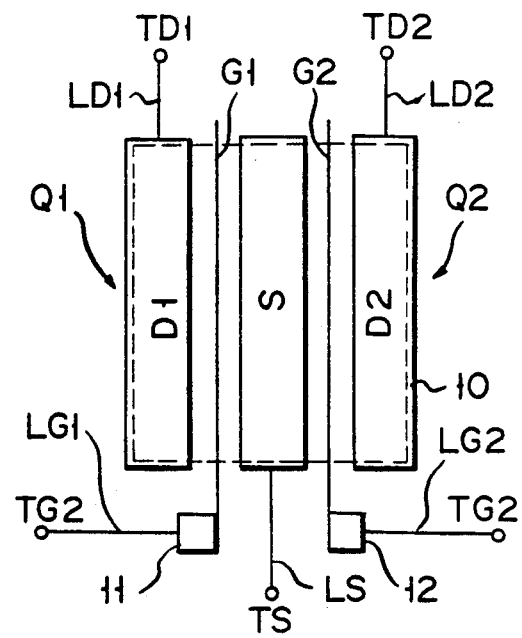
FIG. 2 is a plan view showing the plane pattern of the differential transistor circuit shown in FIG. 1.
Figure 3:
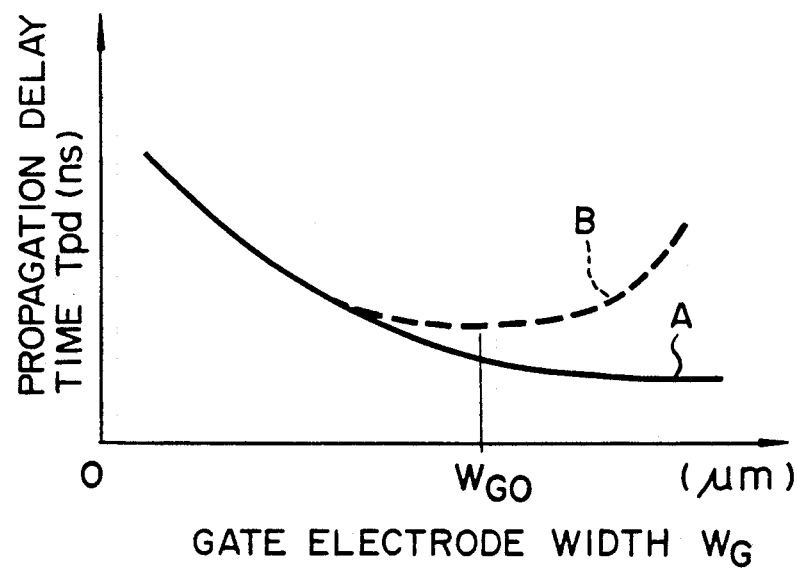
FIG. 3 is a graph showing variation in the propagation delay time with respect to the width of the gate electrode of an FET.
Figure 4:
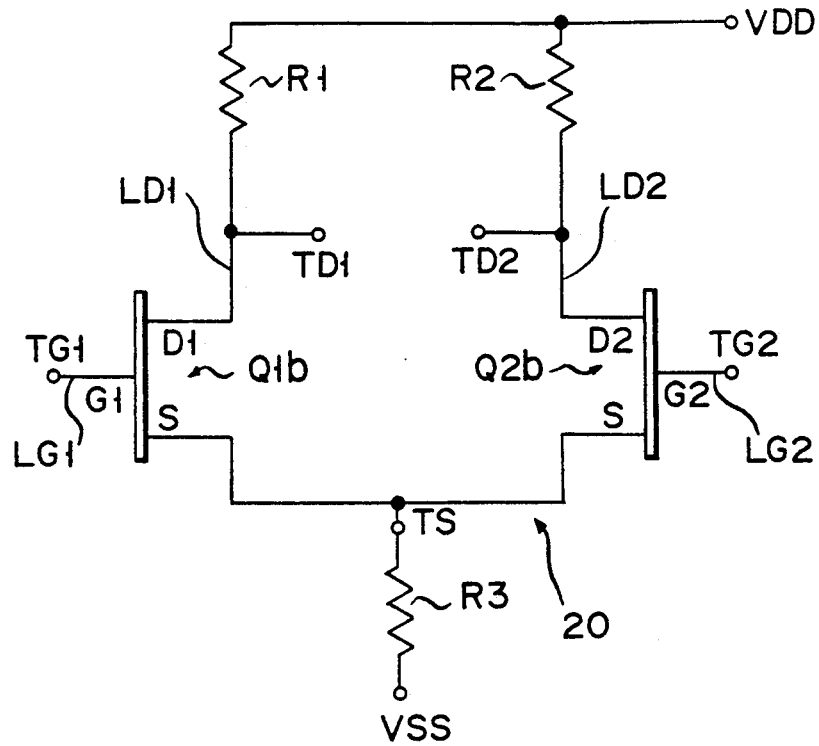
FIG. 4 is a circuit diagram showing a differential transistor circuit according to an embodiment of this invention.

FIG. 4 shows differential transistor circuit 20 according to an embodiment of this invention in which differential transistor circuit 20 is constituted by a pair of MESFETs. In FIG. 4, gate G1 of N-channel MESFET Q1b is connected to gate terminal TG1 via wiring LG1. Drain D1 of FET Q1b is connected to first drain terminal TD1 via wiring LD1 and to power source terminal VDD via wiring LD1 and resistor R1. Gate G2 of N-channel MESFET Q2b is connected to gate terminal TG2 via wiring LG2. Drain D2 of FET Q2b is connected to drain terminal TD2 via wiring LD2 and to power source terminal VDD via wiring LD2 and resistor R2.

The sources S of FETs Q1b and Q2b are connected to each other, and connection node TS therebetween is connected to ground terminal VSS via resistor R3.

Figure 5:
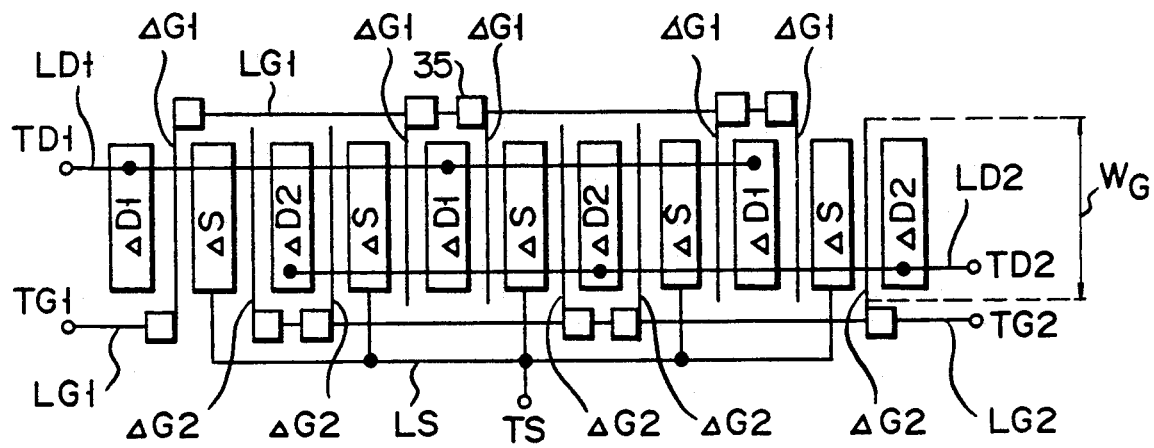
FIG. 5 is a plan view showing the arrangement pattern of a pair of FETs constituting the differential transistor circuit shown in FIG. 4.

FIG. 5 shows the arrangement pattern of FETs Q1b and Q2b constituting differential transistor circuit 20 shown in FIG. 4. In FIGS. 4 and 5, drain D1 of FET Q1b is divided into three drain regions ΔD1. Also, drain D2 of FET Q2b is divided into three drain regions ΔD2. Divided drain regions ΔD1 and ΔD2 are formed so as to have the same dimensions. Drain regions ΔD1 of FET Q1b and drain regions ΔD2 of FET Q2b are alternately arranged at a regular interval as shown in FIG. 5.

The common sources of FETs Q1b and Q2b are each divided into five source regions ΔS of the same dimensions. Divided source regions ΔS are disposed between adjacent divided drain regions ΔD1 and ΔD2. Gate G1 of FET Q1b is divided into five gate electrodes ΔG1 having the same gate electrode width WG.

Divided gate electrodes ΔG1 are each disposed between a corresponding one of divided drain regions ΔD1 and an adjacent one of divided source regions ΔS. Like gate G1 of FET Q1b, gate G2 of FET Q2b is divided into five gate electrodes ΔG2 having the same gate electrode width WG. Divided gate electrodes ΔG2 are each disposed between a corresponding one of divided drain regions ΔD2 and an adjacent one of divided source regions ΔS.

Electrodes of divided drain regions ΔD1 are connected to each another via wiring LD1, and electrodes of divided drain regions ΔD2 are connected to each other via wiring LD2. Further, electrodes of divided source regions ΔS are connected to each other via wiring LS. Likewise, divided gate electrodes ΔG1 are connected to each other via wiring LG1 and divided gate electrodes ΔG2 are connected to each other via wiring LG2.

In general, a parasitic capacitance will occur at the intersection of the wirings, due to which the operation speed of the differential transistor circuit is lowered. In this embodiment, wirings LG1 and LG2 are arranged at respective sides of the arrangement consisting of divided source regions ΔS, divided drain regions ΔD1 and ΔD2, and divided gate electrodes ΔG1 and ΔG2, and at the same time, wirings LD1 and LD2 are disposed above the arrangement of the divided source and drain regions and divided gate electrodes. In other words, the arrangement consisting of divided source regions ΔS, divided drain regions ΔD1 and ΔD2, and divided gate electrodes ΔG1 and ΔG2 has wiring LG1 on one side and wiring LG2 on its other side. The arrangement also has wirings LD1 and LD2 above it. With this structure, the number of intersections of the wirings can be reduced, thus reducing the parasitic capacitance.

In FETs Q1b and Q2b of the arrangement pattern shown in FIG. 5, the divided source regions, divided drain regions and divided gate electrodes of FETs Q1b and Q2b are disposed close to one another and alternately arranged. Therefore, even if the material of the substrate and the manufacturing conditions are changed, the pair property of FETs Q1b and Q2b can be preferably set. Further, gates G1 and G2 of FETs Q1b and Q2b are each divided into a plurality of divided gate electrodes ΔG1 and ΔG2 so that the distributed resistance of the gate electrode of each of FETs Q1b and Q2b can be set lower than that of the ordinary FET whose gate electrode is not divided. As a result, the differential transistor circuit of this embodiment can attain a good pair property of the FETs and high operation speed.

According to the experiments made by the inventor, it was confirmed that propagation delay time Tpd of the differential transistor circuit of this embodiment having the pattern shown in FIG. 5 was reduced by 10 to 20 % in comparison with that of the conventional circuit.

FIG. 6 is a cross sectional view of the plane pattern shown in FIG. 5 taken along wiring LD1. In FIG. 6, N$^+$-type drain diffusion layers 24a and 24b of high impurity concentration and N+-type source layer 25 are formed in one of the main surface areas of semiinsulative GaAs substrate 23. Further, N-type active regions 26 are formed between N+-type drain diffusion layer 24a and N+-type source diffusion layer 25 and between N+-type drain diffusion layer 24b and N+-type source diffusion layer 25 in the surface area of substrate 23. Drain electrode 28a is formed on N+-type drain diffusion layer 24a via metal film 27a which is formed in ohmic contact with N+-type drain diffusion layer 24a. Likewise, drain electrode 28b is formed on N−-type drain diffusion layer 24b via metal film 27b which is formed in ohmic contact with N+-type drain diffusion layer 24b.

Source electrode 30 is formed on N+-type source diffusion layer 25 via metal film 29 which is formed in ohmic contact with N+-type source diffusion layer 25. Further, divided gate electrodes ΔG1 and ΔG2 are respectively formed on, and in Schottky contact with, N-type active regions 26. Drain electrode 28a is connected to wiring LD1 formed on interlayer insulation film 31 via contact portion 32.

In FIG. 6, N+-type drain diffusion layer 24a, metal film 27a and drain electrode 28a constitute divided drain region ΔD1, and N+-type drain diffusion layer 24b, metal film 27b and drain electrode 28b constitute divided drain region ΔD2. Further, N+-type source diffusion layer 25, metal film 29 and source electrodes 30 constitute divided source region ΔS.

In the above embodiment, the differential transistor circuit having the MESFETs is explained, but the transistor arrangement of this invention can be applied to a differential transistor circuit having MOSFETs.

FIG. 7 is a cross sectional view of a plane pattern which corresponds to that of FIG. 5 and in which MOSFETs are used instead of the MOSFETs. In this case, P-type silicon substrate 40 is used instead of GaAs substrate 23 of FIG. 6 and gate insulation films 41 are respectively formed between substrate 40 and divided gate electrodes ΔG1 and ΔG2. Further, N-type active regions 26 are not formed in this example. Other portions are the same as those of FIG. 6.

Figure 8:
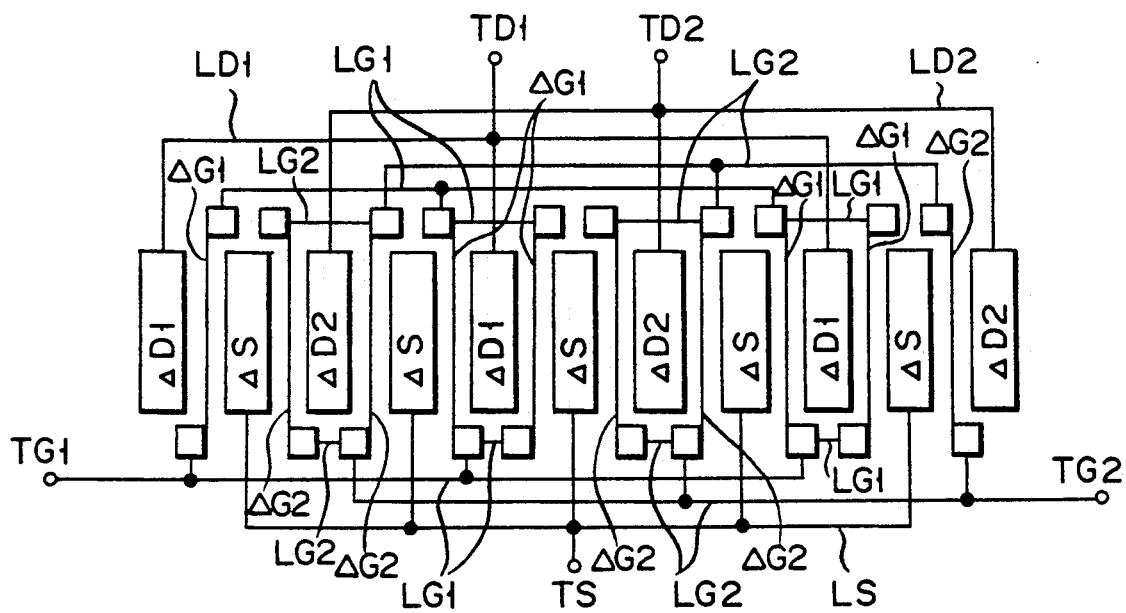
FIG. 8 is a plan view showing the arrangement pattern of a pair of FETs according to a second embodiment.

FIG. 8 shows the arrangement pattern of a pair of FETs constituting a differential transistor circuit according to a second embodiment of this invention. In this embodiment, the arrangement of divided source regions ΔS, divided drain regions ΔD1 and ΔD2, and divided gate electrodes ΔG1 and ΔG2 is the same as that of the corresponding regions and electrodes of the first embodiment shown in FIG. 5. Also, in this embodiment, the resistance of the gate electrode can be reduced and the pair property of the FETs can be improved. The wiring pattern in the second embodiment is different from that of the first embodiment.

That is, gate wiring LG1 is arranged along and on both sides of the arrangement of divided drain regions ΔD1 and ΔD2, divided source regions ΔS and divided gate electrodes ΔG1 and ΔG2. In this case, wiring LG1 is arranged to surround divided drain regions ΔD1 except the outermost one of divided drain regions ΔD1 in cooperation with divided gate electrodes ΔG1. Likewise, wiring LG2 is arranged along and on both sides of the arrangement of divided drain regions ΔD1 and ΔD2, divided gate electrodes ΔG1 and ΔG2 and divided source regions ΔS. In this case wiring LG2 is arranged to surround divided drain regions ΔD2 except the outermost one of divided drain regions ΔD2 in cooperation with divided gate electrodes ΔG2.

As described above, divided gate electrodes ΔG1 are connected to each other at various portions and divided gate electrodes ΔG2 are connected to each other at various portions so that gate currents of divided gate electrodes ΔG1 can be made constant and gate currents of divided gate electrodes ΔG2 can be made constant. As a result, a pair of FETs having a more improved pair property can be obtained.

Figure 9:
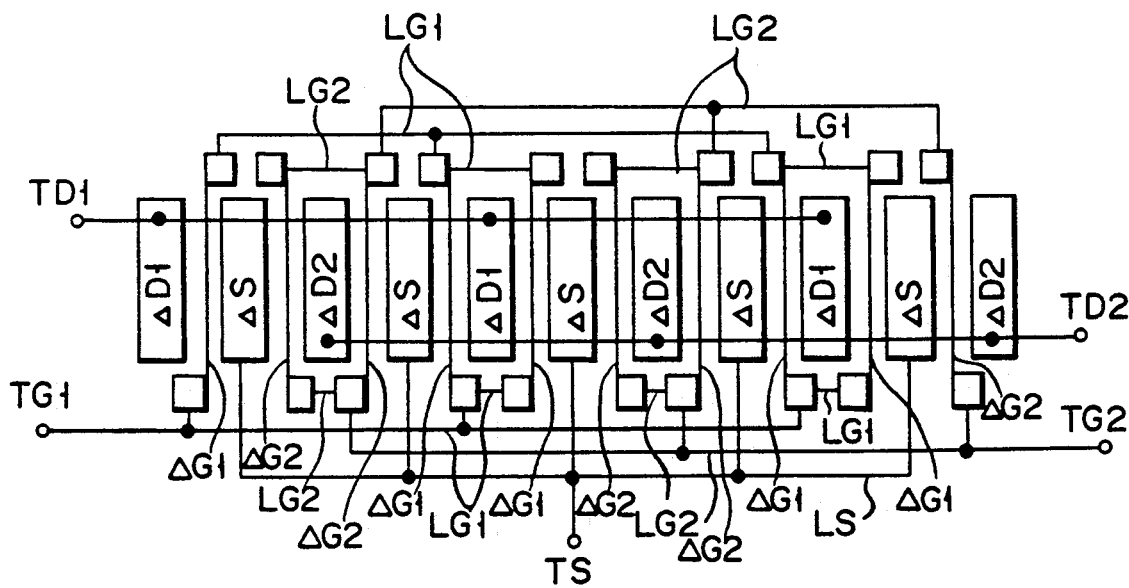
FIG. 9 is a plan view showing the arrangement pattern of a pair of FETs according to a third embodiment.

FIG. 9 shows the arrangement pattern of a pair of FETs constituting a differential transistor circuit according to a third embodiment of this invention. Like the second embodiment of FIG. 8, a wiring pattern of this embodiment is formed in which wiring LG1 and divided gate electrodes ΔG1 are arranged to surround divided drain regions ΔD1 and wiring LG2 and divided gate electrodes ΔG2 are arranged to surround divided drain regions ΔD2. This embodiment is different from the former embodiment in that wirings LD1 and LD2 are formed above the arrangement pattern of divided drain regions ΔD1 and ΔD2, divided source regions ΔS and divided gate electrodes ΔG1 and ΔG2.

In the third embodiment, the number of intersections between the wirings can be reduced in comparison with the case of the second embodiment, therefore the parasitic capacitance between the wirings can be reduced. As a result, a differential transistor circuit whose operation speed is higher than that of the second embodiment can be obtained.

As described above, in the differential transistor circuit using the arrangement pattern of a pair of FETs according to this invention, the operation speed and pair property of the differential transistor circuit can be improved.

What is claimed:

1. A semiconductor integrated circuit including a differential transistor circuit having first and second FETs which each include a drain, a source, and a gate, and whose sources are connected to each other, comprising:
   a plurality of first divided drain regions and a plurality of second divided drain regions the same in number, as that of said first divided drain regions, said first and second divided drain regions being arranged alternately, at regular intervals and respectively serving as the drains of said first and second FETs;
   a plurality of divided source regions arranged with one source region between each adjacent pair of first and second divided drain regions and serving as the sources of said first and second FETs;
   a plurality of first divided gate electrodes, arranged between said first divided drain regions and said divided source regions and serving as the gate of said first FET;
   a plurality of second divided gate electrodes, arranged between said second divided drain regions and said divided source regions and serving as the gate of said second FET;
   a first drain wiring for connecting said plurality of first divided drain regions to each other; and
   a second drain wiring for connecting said plurality of second divided drain regions to each other;
   wherein said first and second drain wirings are arranged above the arrangement of said first and second divided drain regions, said divided source regions, and said first and second divided gate electrodes.

2. A semiconductor integrated circuit according to claim 1, wherein said first and second FETs are each formed as a MESFET.

3. A semiconductor integrated circuit according to claim 1, wherein said first and second FETs are each formed as a MOSFET.

4. A semiconductor integrated circuit including a differential transistor circuit having first and second MESFETs which each include a drain, a source, and a gate, and whose sources are connected to each other, comprising:
- a plurality of first divided drain regions and a plurality of second divided drain regions the same in number as that of said first divided drain regions, said first and second divided drain regions being arranged alternately, at regular intervals and respectively serving as the drains of said first and second MESFETs;
- a plurality of divided source regions, arranged with one source region between each adjacent pair of first and second divided drain regions and serving as the sources of said first and second MESFETs;
- a plurality of first divided gate electrodes, arranged one between, but not effectively overlapping, each adjacent pair of first divided drain regions and said divided source regions and serving as the gate of said first MESFET; and
- a plurality of second divided gate electrodes, arranged between, but not effectively overlapping, said second divided drain regions and said divided source regions and serving as the gate of said second MESFET.

5. A semiconductor integrated circuit according to claims 1 or 4 wherein said plurality of first divided gate electrodes are formed with the same gate electrode width and said plurality of second divided gate electrodes are formed with the same gate electrode width as the gate electrode width of said first divided gate electrodes.

6. A semiconductor integrated circuit according to claims 1 or 4 wherein said plurality of first divided drain regions are formed with the same dimensions and said plurality of second divided drain regions are formed with the same dimensions as those of said first divided drain regions.

7. A semiconductor integrated circuit according to claims 1 or 4, wherein said plurality of divided source regions are connected to each other by means of a source wiring, said plurality of first divided gate electrodes are connected to each other by means of a first gate wiring, and said plurality of second divided gate electrodes are connected to each other by means of a second gate wiring.

8. A semiconductor integrated circuit according to claim 7, wherein said first and second gate wirings are arranged along and on a plurality of respective sides of the arrangement of said divided source regions, said divided drain regions, and said first and second gate electrodes.

9. A semiconductor integrated circuit according to claim 7, wherein said first gate wiring is arranged to surround said first divided drain regions in combination with said first divided gate electrodes and second gate wiring is arranged to surround said second divided drain regions in combination with said second divided gate electrodes.

10. A semiconductor integrated circuit according to claim 9, wherein each divided gate electrode is electrically coupled to at least one other gate electrode at a plurality of locations.

* * * * *